(12) United States Patent
Potter et al.

(10) Patent No.: US 8,395,391 B2
(45) Date of Patent: Mar. 12, 2013

(54) METHOD AND APPARATUS FOR LOCATING A PARALLEL ARC FAULT

(75) Inventors: Frederick J. Potter, Trumbauersville, PA (US); Vitaliy Mosesov, Bellevue, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 414 days.

(21) Appl. No.: 12/583,396

(22) Filed: Aug. 19, 2009

(65) Prior Publication Data

US 2011/0043214 A1   Feb. 24, 2011

(51) Int. Cl.
*G01R 31/08* (2006.01)
(52) U.S. Cl. ....................................................... 324/525
(58) Field of Classification Search ........... 324/512–536
See application file for complete search history.

(56) References Cited

U.S. PATENT DOCUMENTS

| | | | |
|---|---|---|---|
| 5,682,101 A | 10/1997 | Brooks et al. | 324/536 |
| 5,706,159 A | 1/1998 | Dollar, II et al. | 361/113 |
| 6,583,975 B2 | 6/2003 | Bax | 361/93.1 |
| 6,751,528 B1 | 6/2004 | Dougherty | 700/293 |
| 7,038,897 B2 | 5/2006 | Csanky et al. | 361/42 |
| 7,068,045 B2 | 6/2006 | Zuercher et al. | 324/536 |
| 7,190,562 B2 | 3/2007 | Pellon et al. | 361/5 |
| 7,253,640 B2 | 8/2007 | Engel et al. | 324/622 |
| 7,254,004 B2 | 8/2007 | Mladenik et al. | 361/93.1 |
| 7,366,622 B1 | 4/2008 | Nemir et al. | 702/58 |
| 7,391,281 B2 | 6/2008 | Chao et al. | 324/520 |
| 7,603,243 B2 * | 10/2009 | Schlapp et al. | 702/59 |
| 2010/0149700 A1 * | 6/2010 | Hastings et al. | 361/42 |

OTHER PUBLICATIONS

Blemel et al., Applications of microsystems and signal processing for wiring integrity monitoring, Aerospace Conference, 2001, IEEE Proceedings, vol. 7, pp. 3247-3253, 2001.*
Potter, Thomas E. et al., Arc Fault Circuit Interruption Requirements for Aircraft Applications, Texas Instruments, www.arc-shield.com, Oct. 2003.

* cited by examiner

*Primary Examiner* — Melissa Koval
*Assistant Examiner* — Daniel Miller
(74) *Attorney, Agent, or Firm* — Wiggin and Dana LLP; Gregory S. Rosenblatt

(57) ABSTRACT

Methods to determine the location of an arc fault include a first method utilizing the inherent resistance per unit length of the wire. A second and a third method utilize an inherent inductance per unit length of the wire. The second method derives the inherent inductance from the output voltage and a rate of current rise. The third method derives the inherent inductance from a resonant frequency of an oscillating current. The information is useful to locate a fault emanating from a wire member of a wiring harness used to distribute power about an aircraft.

11 Claims, 15 Drawing Sheets

METHOD AND APPARATUS FOR LOCATING A PARALLEL ARC FAULT

CROSS REFERENCE TO RELATED APPLICATION(S)

N.A.

U.S. GOVERNMENT RIGHTS

N.A.

BACKGROUND

1. Field

This invention relates to methods and systems to determine the location of an arc fault between adjacent wires in a wiring harness, such as used to provide power to widely separated locations and components on an aircraft. More particularly, by utilizing length dependent properties of the wires, such as resistance and inductance, the distance to a remote parallel arc-fault may be calculated.

2. Description of the Related Art

Aircraft require electrical power delivered to widely separated locations throughout the aircraft. Flight crucial circuits include external lighting, instrument panels and communications. Non-flight critical circuits include in-flight entertainment systems and galleys. One or more generators on the plane satisfy the aircraft electrical system requirements and typically produce 115 volts AC, 400 hertz. Some present day electrical components utilize 28 volts DC. Other voltage requirements, such as 270 volts DC and variable frequencies, are being considered for future aircraft. The electrical power is delivered from the generators to the electrical systems through wiring harnesses that contain bundles of wires. Such harnesses may include in excess of 50 wires and have wires of variable lengths, from under 5 feet up to several hundred feet in length.

The bundled wires are individually coated with a polymer insulator, such as polyimide. Over time, and due to environmental factors such as heat, the insulation may wear away or crack exposing an encased conductor. If two conductors are exposed in close proximity, an electric current may arc from one conductor to the other. Arcing may also occur between a single exposed conductor and the airframe. This type of fault is referred to as a parallel arc fault. Arcing can degrade insulation of adjacent wires and is a fire hazard. Therefore, it is necessary to suppress the arc as quickly as possible. Thermal circuit breakers were developed to protect the wire insulation on aircraft from damage due to overheating conditions caused by excessive over-current conditions. The thermal circuit breakers are generally not effective to protect against an arc fault. The arc fault is often an intermittent problem occurring during a specific condition, such as in-flight vibration of an aircraft frame. The arc is transient, frequently on the order of milliseconds, such that a current overload and thermal increase does not occur, rendering a thermal circuit breaker ineffective.

A circuit interrupter that detects an arc fault and interrupts the flow of current is disclosed in U.S. Pat. No. 5,682,101 to Brooks, et al. The patent discloses a method to detect an arc fault by monitoring the rate of change of electrical current as a function of time (di/dt) and generating a pulse each time di/dt is outside a predetermined threshold. An arc fault signal is sent to a circuit breaker or other safety device if the number of pulses per a specified time interval exceeds a threshold. U.S. Pat. No. 5,682,101 is incorporated by reference in its entirety herein.

An electronic circuit breaker that detects arc faults enhances aircraft safety, but does not assist in determining the location of the fault. Wiring bundles on an aircraft may extend for several hundred feet and are typically inaccessible, such as under floorboards or extending through wing struts. Locating a fault is time consuming and requires considerable effort to access the wire bundle. U.S. Pat. No. 7,253,640 to Engel, et al. discloses a method to determine a distance to an arc fault that employs the value of the peak arc current, the wire resistance per unit length, and a nominal peak line to neutral voltage value. A constant arc voltage or an arc voltage as a function of the value of the peak current is then provided to calculate the distance from the arc fault detector to the arc fault. U.S. Pat. No. 7,253,640 is incorporated by reference in its entirety herein.

Using wire resistance to locate an arc fault is of limited value. The magnitude of resistance of the wires is typically in the milliohm range while the resistance of the arc is unpredictable and variable and can be from zero to tens of ohms. As a result, this method is prone to large error.

There remains, therefore, a need for a method and system to more accurately locate an arc fault to thereby more readily facilitate repair of damaged insulation and wires.

BRIEF SUMMARY

The details of one or more embodiments of the disclosure are set forth in the accompanying drawings and the description below. Other features, objects and advantages will be apparent from the description and drawings, and from the claims.

It is an object to provide herein methods and systems for determining the location of an arc fault, such as emanating from a wire member of a wiring harness of an aircraft. A first method utilizes an inherent resistance per unit length of the wire. Second and third methods utilize an inherent inductance per unit length of the wire. The second method derives the inherent inductance from the output voltage and a rate of current rise. The third method derives the inherent inductance from a resonant frequency of an oscillating arc current.

The first method includes the steps of measuring a distance to an arc emanating from the wire by obtaining an output voltage and a peak current, calculating a resistance of the wire up to the arc from $R_{wires}=V_0/I_{arc(peak)}$ and then utilizing an inherent resistance per unit length of the wire to determine a distance to fault.

The second method includes the steps of measuring a distance to an arc emanating from the wire by obtaining an output voltage and a rate of current rise as a function of time, di/dt, calculating an inductance of the wire from $L_{wire}=V_{source}$ (di/dt) utilizing an inherent inductance per unit of length of the wire to determine a distance to fault.

The third method includes the steps of measuring a distance to an arc emanating from the wire by isolating the voltage source from the wire with a decoupling inductor, inserting an output capacitor between the decoupling inductor and a load, measuring a resonant frequency of a current oscillating around a loop defined by the output capacitor, the inductance of the wire, the arc and a ground, calculating an inductance of the wire up to the arc and utilizing an inherent inductance per unit of length of the wire to determine a distance to fault.

A system to utilize the third method includes a voltage source, a load, a wiring harness having a plurality of parallel running insulated wires with at least one of the plurality of wires electrically interconnected to the voltage source and to the load. A decoupling inductor is disposed between the voltage source and the wiring harness and is effective to provide RF isolation of the voltage source from the wiring harness. An output capacitor is disposed between the decoupling inductor and the wiring harness. An output buffer is effective to store data related to a waveform oscillating around a loop defined by the output capacitor, the wire, an arc bridging the wire and a ground, and the ground return.

BRIEF DESCRIPTION OF THE DRAWINGS

Like reference numbers and designations in the various drawings indicated like elements.

DETAILED DESCRIPTION

Figure 1:
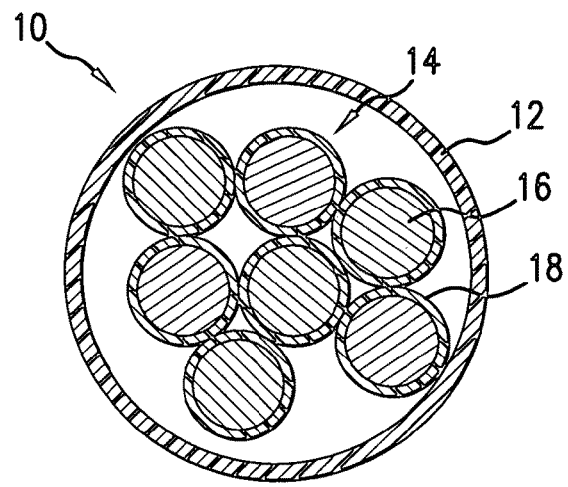
FIG. 1 illustrates in cross-sectional representation an aircraft wiring harness as known from the prior art.

FIG. 1 illustrates a wiring harness 10 in cross-sectional representation. A restraining band 12 supports a bundle of wires 14. Each wire 14 has an electrically conductive core 16 sheathed in an electrically insulating jacket 18. Typically, the jacket 18 is a polymer, such as a polyimide. The bundle may contain in excess of fifty wires 14.

Figure 2:
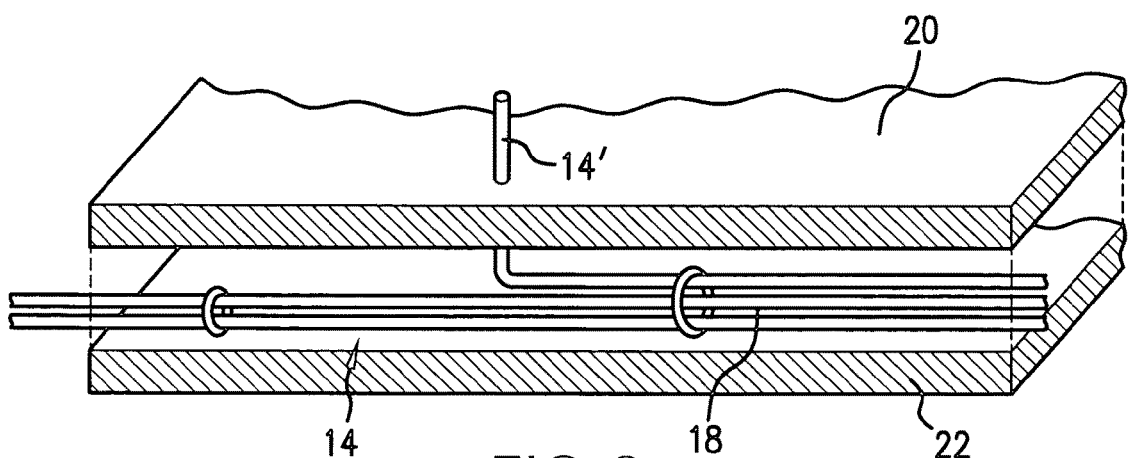
FIG. 2 illustrates a parallel arc fault between two wires contained within the wiring harness of FIG. 1.

With reference to FIG. 2, the bundles of wires 14 extend throughout the aircraft and deliver power to widely separated systems and components. The lengths of wires in the bundles may be from under five feet to in excess of several hundred feet. The bundles travel in areas where space is available, areas frequently having limited accessibility, such as between a cabin floor 20 and a ceiling 22 of a cargo hold. Individual wires 14' separate from the bundle at required locations. For example, the wire 14' may provide power to an in-seat power supply unit for an in flight entertainment system.

If the insulating jackets 18 fail on two wires 14 in proximity, an arc fault may occur. While an electronic circuit breaker, as known from the prior art, is effective to stop the flow of current in the affected wires, locating the fault and repairing the fault in a potentially inaccessible location has, until now, proven difficult. Following are three methods and systems to locate the fault and facilitate repair.

Figure 3:
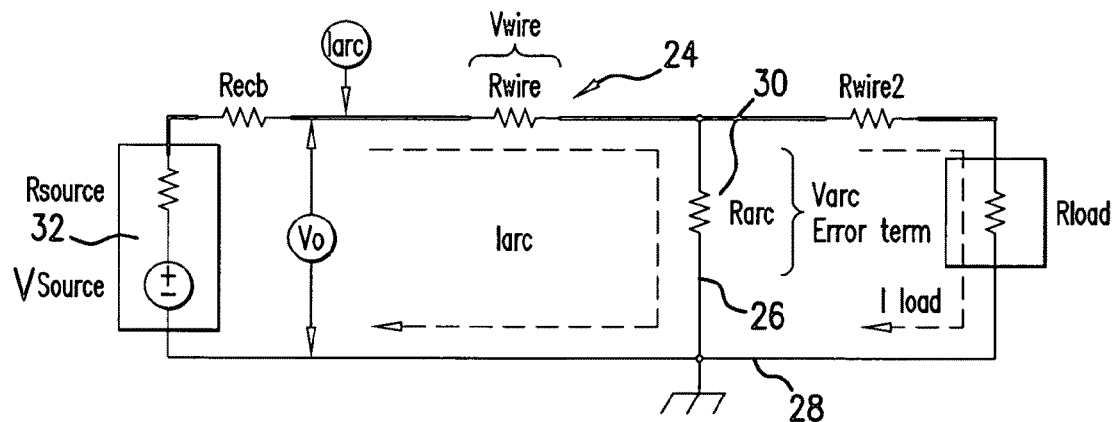
FIG. 3 is a circuit model of a parallel arc fault for detection by wire resistance measurement in accordance with a first embodiment.
Figure 4:
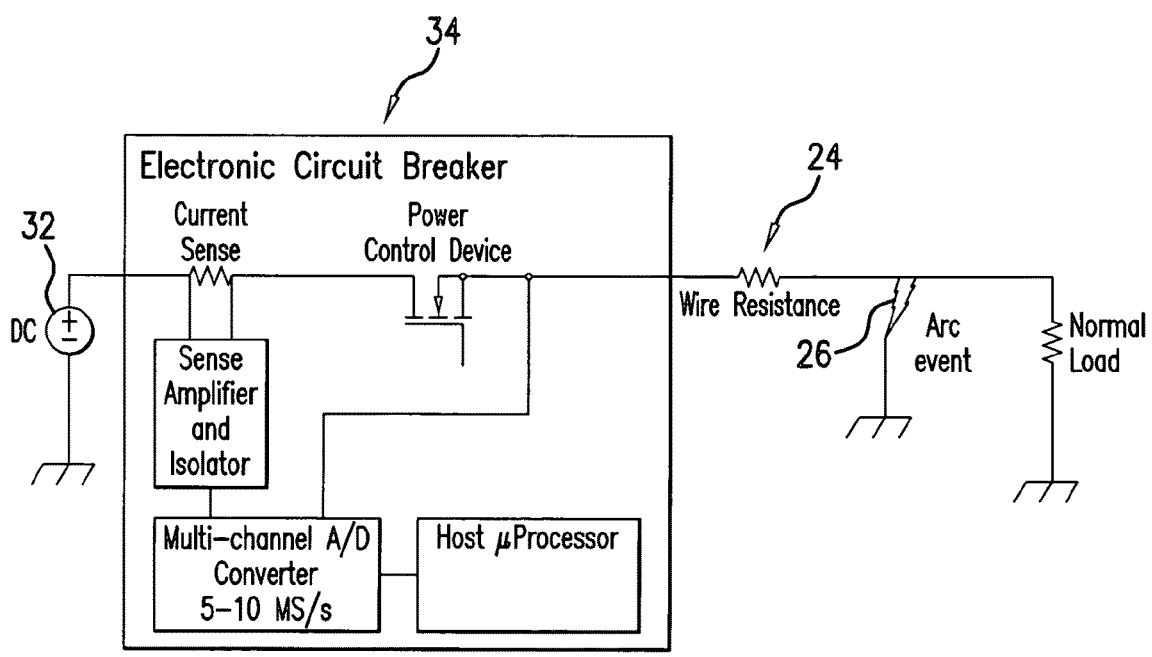
FIG. 4 is block diagram of a system to locate an arc fault detected by the wire resistance method.

A first method to estimate the location of an arc fault utilizes wire resistance. A circuit modeling the harness is illustrated in FIG. 3 and FIG. 4 is a block diagram of a system to locate an arc fault by the wire resistance method.

The resistance of the wiring harness represented by $R_{wire}$ 24 is the total of all resistance in series with the arc 26. If the arc 26 is to the airframe 28, than it is the resistance of the single wire that is arcing, as shown in FIG. 3. If the arc is between two wires, the resistance is the total resistance of both wires. Uncertainty of the total resistance is one reason a resistance measurement system is inaccurate.

The resistance of the arc represented by $R_{arc}$ 30;

The voltage of the source 32, e.g. generator output, is represented by $V_{source}$;

The in-series resistance of the electronic circuit breaker (ecb) and the voltage source is represented by $R_{source}$ $R_{ecb}$.

The resistance of the wire relates the current and the voltage by Ohm's law:

$$R_{wire} = V_o / I_{arc(peak)} \quad (1)$$

Where $I_{arc(peak)}$ is peak measured current in the circuit and $V_o$ is measured output voltage of the electronic circuit breaker 34. The distance to fault (DTF) is then the measured value for $R_{wire}$ 24 divided by the inherent resistance per unit of length value for the wire gauge and composition.

Error in the circuit model of FIG. 3 comes from the unknown arc resistance 30 that created voltage drop $V_{arc}$ across it. In an ideal scenario, the voltage drop across the wires is equal to the $V_o$. However in reality, the arc resistance 30 will cause $V_o$ to be divided between $V_{wire}$ and $V_{arc}$ introducing an error. When $I_{arc}$ is at a maximum we can assume that arc resistance is at a minimum and most of the $V_o$ is dropped across the $R_{wire}$ reducing this error term to a minimum. The percent error in a DTF calculation is given by:

$$\% \text{ Error} = (I_{arc} * R_{arc} / V_0) * 100\% \quad (2)$$

or as a ratio of resistances:

$$\% \text{ Error} = (R_{arc} / R_{wire}) * 100\% \quad (3)$$

The magnitude of $R_{wire}$ 24 is typically in milliohms range while $R_{arc}$ 30 is unpredictable and variable between 0 ohm and tens of ohms. Because of this possible error range, this method has limited use. The method can, however, be used to do an initial prediction where a fault might be located. If the peak arc current is large enough where it can actually be caused by resistance of the installed harness, an assumption can be made that the arc resistance 30 is 0 ohm. This typically is a brief condition that can occur during the arc fault when the faulty conductors briefly weld themselves together. Fast response point of the ECB 34 can also be used to predict the section of the wire where the fault occurred. If arc resistance 30 is at 0 ohms, every wire gauge will have a critical length for which hard faults will always result in an $I^2t$ (a common rating value for circuit breakers where I is current and t is time) trip and never a fast response loop. This information can be used to predict where the fault is located.

Figure 5:
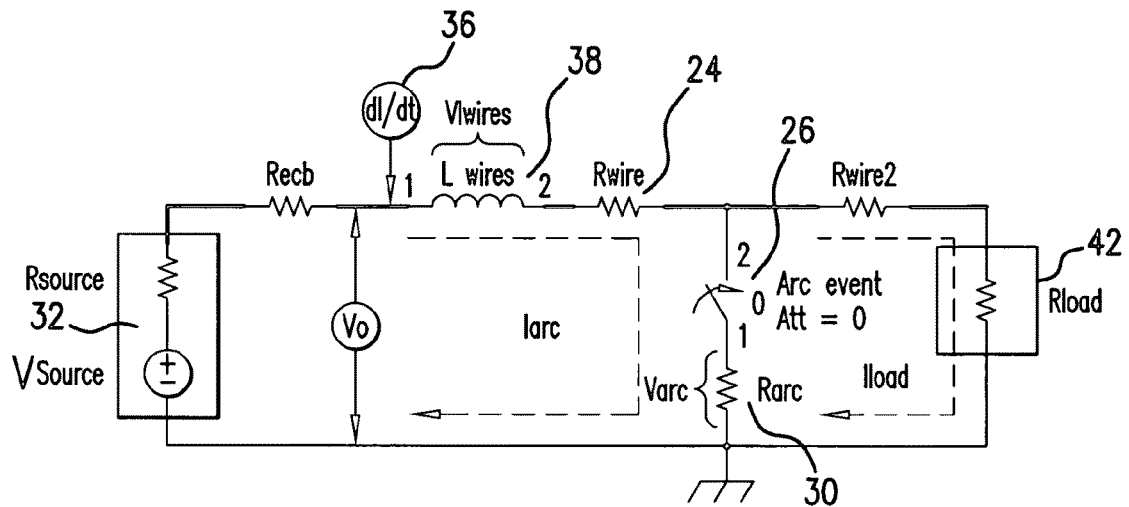
FIG. 5 is a circuit model of a parallel arc fault for detection by change in current (di/dt) as a factor of time in accordance with a second embodiment.
Figure 6:
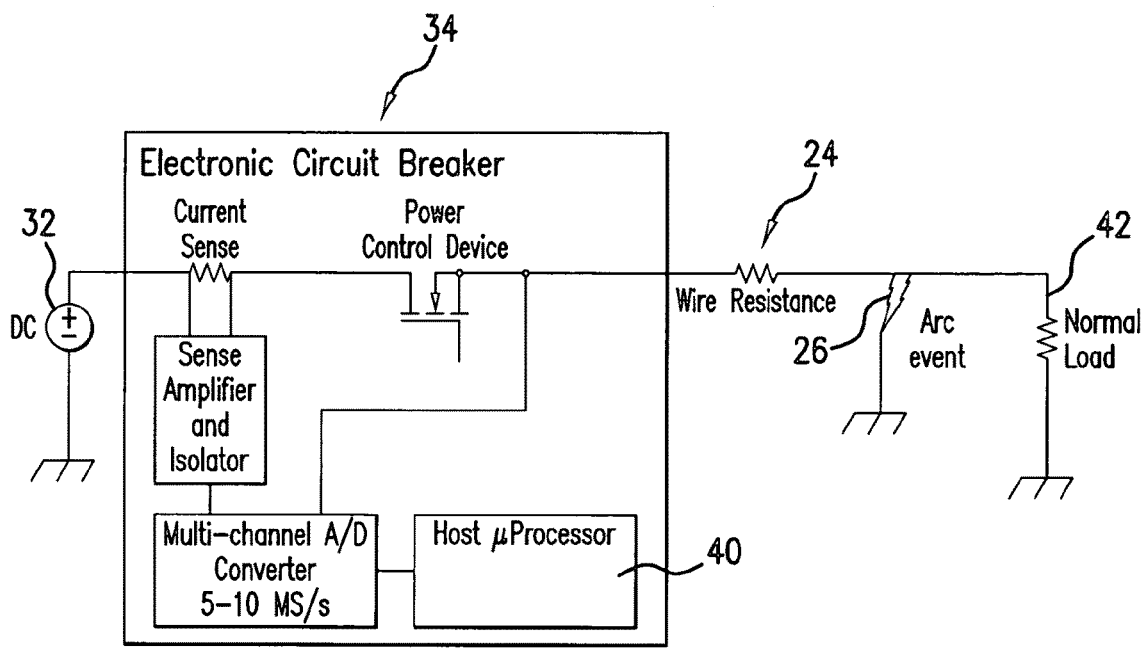
FIG. 6 is block diagram of a system to locate an arc fault detected by the di/dt method.

A second method to estimate the location of an arc fault 26 utilizes inductor di/dt 36. A circuit modeling the harness with the wire inductance $L_{wire}$ 38 and wire resistance $R_{wire}$ 24 in series is illustrated in FIG. 5. FIG. 6 is a block diagram of the system to locate an arc fault by the inductor di/dt method. The system is similar to that illustrated in FIG. 4 for the wire resistance method except that the microprocessor 40 does a different set of calculations using the same basic data.

$R_{arc}$ 30 is the resistance of the arc 26.
$V_{source}$ is the source 32 voltage.
$R_{source}$ is the source 32 resistance.
$R_{ecb}$ is the resistance of an electronic circuit breaker 34.
$R_{source}+R_{ecb}$ are in series resistance of the circuit breaker and the voltage source.

Before a parallel arc fault event, an initial condition is established by the current flowing from the source 32 into the load 42. When an arc 26 strikes at some distance from the circuit breaker 34, it forms a closed loop defined by $L_{wires}$, $R_{wires}$, $R_{arc}$, $V_{source}$, $R_{source}$ and $R_{ecb}$. The circuit can be described by analyzing a step response typical of an LR circuit. Due to the influence of $L_{wires}$, the arc current does not rise to its final value instantaneously. The rate of current rise, di/dt 36, is a function of inductance and voltage drop across $L_{wires}$:

$$L_{wires}=V_{source}(di/dt) \quad (4)$$

or $$di/dt=V_{source}/L_{wires} \quad (5)$$

A more accurate equation takes into account the voltage drop associated with its series resistance:

$$V_{source}-i(t)R_{source}-i(t)R_{ecb}-i(t)R_{wire}-i(t)R_{arc}=L_{wires}*di/dt \quad (6)$$

where:
i(t) is current flowing through the harness at time, t.
$R_{arc}$ is resistance of an arc 26 when the arc strikes.

As a first order approximation, we assume that $R_{ecb}$ and $R_{source}$ are sufficiently low so that $V_{source}=V_o$.
We can also assume that $R_{wires} \ll R_{arc}$ and can be approximated to be 0 ohms.

The equation for the inductance of the wires 38 is then given by:

$$L_{wires}=(V_{source}-i(t)R_{arc})/(di/dt) \quad (7)$$

In the absence of $R_{arc}$ 30, the rate of current rise di/dt 36 is simply a ratio of $V_{source}/L_{wires}$. However, resistance of an arc 30 is an unknown and unpredictable value resulting in an error term in the equation given by $i(t)R_{arc}$ as a voltage drop across the arc 26 itself. The instant when the switch closes the original steady state $I_{load}$ current is maintained through the arc setting the initial condition. That current will establish initial voltage drop across the arc resistance 30. The actual current I(t) is given by:

$$I(t)=(V_{source}/R_{arc})+(I_{load}-(V_{source}/R_{arc}))\exp(R_{arc}/L_{wires})*t \quad (8)$$

and the actual di/dt is given by:

$$di/dt=((V_{source}-R_{arc}*I_{load})/L_{wires})\exp(R_{arc}/L_{wires})*t \quad (9)$$

di/dt is dependent on the length of the closed loop, one segment of which is the arc fault. Therefore, knowing di/dt enables a calculation of the DTF by calculating the inductance of the fault loop: $V_{source} \times dt/di = L_{wire}$. For a particular wire gauge and type, there is a constant inductance per linear foot, K (μH/ft). Then calculate the distance to the fault: DTF=½(L/K).

As seen from the equations, the actual rate of current rise in the circuit is not a constant value, rather the current increases exponentially approaching $V_{source}/R_{arc}$ as final value. A percent error in distance to fault calculations can be thought of as the difference between expected and actual voltage across $L_{wires}$. That difference is the voltage across $R_{arc}$. If $V_{source}$ is the expected voltage drop when $R_{arc}$=0 ohm, then:

$$\% \text{ Error}=-(i(t)R_{arc})/V_{source})*100\%=[((V_{source}-R_{arc}*I_{load})\exp(R_{arc}/L_{wires})*t)/V_{source}]*100\% \quad (10)$$

Percent error in measuring di/dt and thus in distance to fault computation depends on several variables: the resistance of the arc, initial load current and time of measurement. Resistance, $R_{arc}$, can be viewed as the sum of every in-series resistance shown in Equation 6 for more accurate error prediction.

Figure 7:
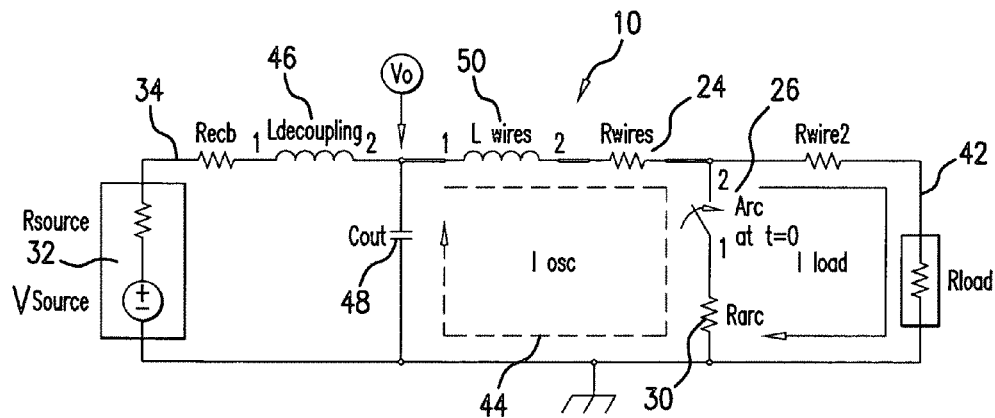
FIG. 7 is a circuit model of a parallel arc fault for detection by inductance-capacitance-resistance (LCR) oscillation in accordance with a third embodiment.

A third method to estimate the location of an arc fault utilizes the resonant frequency of LCR oscillation. A circuit modeling the harness 10 with oscillating circuit 44 is illustrated in FIG. 7. FIG. 7 shows a simplified schematic of the source 32, electronic circuit breaker 34, harness 10 and load 42 system. $L_{decoupling}$ is an output inductor 46 at the output of the circuit breaker 34 that serves as a decoupling element separating in frequency the source 32 from the harness 10 ($L_{decoupling} \gg L_{wires}$) at high frequencies. Before the parallel arc fault event 26 strikes, there is an initial steady state condition where the load 42 draws current from the source 32 ($I_{load}$). At this point, the output capacitor 48 of the circuit breaker 34, $C_{out}$ is fully charged to the $V_o$ voltage. When the arc 26 strikes, an LCR loop is formed by $C_{out}$, $L_{wires}$, $R_{wires}$+$R_{arc}$. Due to the presence of the output inductor 46, the circuit to the left of $V_o$ is effectively decoupled from an AC perspective.

At this instant we can examine the portion of the circuit formed by $C_{our}$ $L_{wires}$–$R_{wires}$–$R_{an}$ only. Output capacitor 48 $C_{out}$ starts to transfer stored energy via in-series resistance $R_{wires}$ and $R_{arc}$ to the inductor 50 formed by $L_{wires}$. When all the stored energy is transferred to the inductor 50, the inductor 50 starts to charge back the output capacitor 48 with opposite polarity. The cycle continues creating an oscillating current 44 that decays exponentially due to the presence of $R_{wires}$ and $R_{arc}$. The frequency of this oscillation is a function of $L_{wires}$ and $C_{out}$. The resonant frequency range is set by the initial value of the output capacitor 48. The higher the initial value, the lower the resonant frequency range. While higher frequency ranges are advantageous, providing greater sensitivity (change in frequency per foot) and longer oscillation time, the advantages come at the expense of increased hardware complexity. Also, a smaller initial value may increase the effect of an error introduced by parasitic capacitance of the harness 10. An exemplary initial value for the output capacitor is between 1 and 15 nF and a preferred range is between 2 and 5 nF.

Oscillating circuit 44 behavior can be described by analyzing the natural response of a typical LCR circuit. Damping factor, α, ideal resonant frequency $\omega_o$ and damped resonant frequency $\omega_d$ (actual resonant frequency adjusted from ideal due to damping factors) are given by:

$$\omega_o = 1/(L_{wires} * C_{out})^{0.5} \quad (11)$$

$$\alpha = (R_{wires} + R_{arc})/(2 * L_{wires}) \quad (12)$$

$$\omega_d = (\omega_o^2 + \alpha^2)^{0.5} \quad (13)$$

Under-damped oscillation will occur if the combined in-series resistance of the wires 24 and of the arc 30 is less than the critical resistance value:

$$\omega_o^2 > \alpha^2 \quad (14)$$

or $$(R_{wires} + R_{arc}) < 2 * (L_{wires}/C_{out})^{0.5} \quad (15)$$

For the typical length wire contained in wiring harness 10, resistance 24 is in milliohms range and can be omitted from equation 15 causing the arc resistance 30 value to be the decisive factor whether or not oscillation will occur. We estimate the worst case value for the right side of the inequality to be somewhere around 7.5 ohms (assuming the output capacitance 48 to be no more than 0.1 μF and the minimum wire inductor 50 to be 1.4 μH) which is about 5 feet of AWG 14 wire. The worst case arc resistance 30 must be less than that to satisfy the equation.

Equations for the current and voltage in the under-damped LCR circuit are given by:

$$I_{osc}(t) C_1 e^{-\alpha t} \cos(\omega_d t) + C_2 e^{-\alpha t} \sin(\omega_d t) \quad (16)$$

$$V_0 = I_{osc}(t)(R_{wire} + R_{arc}) + L_{wire} * dI_{osc}/dt \quad (17)$$

Constants $C_1$ and $C_2$ are set from the initial current condition in the circuit. At the time t=0, current through the wire inductor 50 is $L_{load}$ setting the constant $C_1$ equal to $I_{load}$. $C_2$ can be found by taking a derivative of the $I_{osc}(t)$ and equating that to the $(dI_{osc}/dt)$ from the voltage Equation 17 at the instant when output capacitor 48 starts discharging into wire inductor 50. At this instant voltage $V_o - (R_{wire} + R_{arc})I_{load}$ is dropped across the wire inductor 50 and series resistance 24, 30 producing:

$$C_2 = (V_0 - (R_{wire} + R_{arc}) * I_{load})/\alpha * L_{wire} \quad (18)$$

Where $[(R_{wire} R_{arc}) * I_{load}]$ is an initial voltage across the wire and the arc resistance 30 is at the instant the arc strikes. This voltage is a result of initial steady state $I_{load}$. Another useful parameter is the total time of the oscillation as amplitude drops to 10% of the initial maximum. This is found by setting the damping coefficient equal to 0.1 and solving for time t $(0.1 = e^{-\alpha t})$.

$$t_{max-10\%} = 4.6 L_{wire}/(R_{wire} + R_{arc}) \quad (19)$$

Unlike the method for locating a fault using inductor di/dt described above, as seen from Equation 16, in the present method the frequency of oscillation does not depend on initial load current $I_{load}$ or time meaning that the DTF may be accurately determined by the resonant frequency. Using fixed value output capacitor 48 of the ECB 34 as C and solving for L, wire inductance, $=(1/\omega)^2/C$. As with the di/dt method, for a particular wire gauge and type, there is a constant inductance per linear foot, K (μH/ft). Then calculate the distance to the fault: DTF=½(L/K). The percent error in resonant frequency introduced by the arc resistance 30 can be estimated from the difference between ideal resonant frequency $\omega_o$ and the actual resonant frequency $\omega_d$:

$$\% \text{ Error} = 100\% * [(\omega_d - \omega_0)/\omega_0] = 100\% * \{[1 - (C_{out} * C_{arc}^2)/4LJ]^{0.5} - 1\} \quad (20)$$

Constraints in the design of hardware for utilizing the LCR oscillation method include:

LCR oscillation event happens once, in a brief time period<50 μS. The circuit must be ready to respond and process the signal first.

LCR oscillation event happens much earlier than actual electronic circuit breaker trip. It is preferred to have a reliable way to recognize and trigger on the event prior to an ECB 34 trip.

The circuit must be able to process frequencies of at least 3 Mhz. An ability to process higher frequencies is beneficial.

Preferably, the waveforms may be stored for diagnostic purposes.

Figure 8:
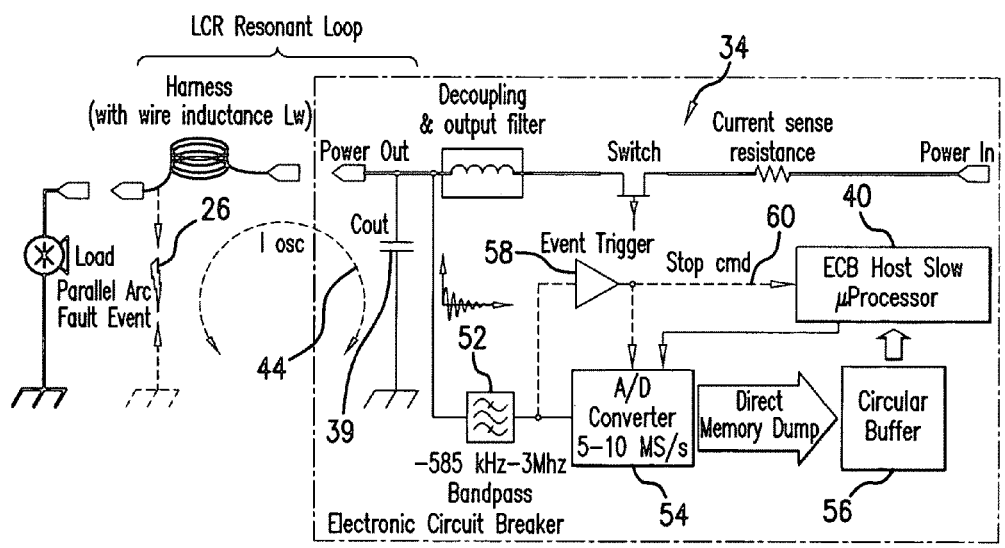
FIG. 8 is block diagram of a system to locate an arc fault detected by the LCR oscillation method.

Digitizing, storing and processing the waveform offers a potential solution. Once the waveform is digitized and stored in the memory it can be processed at a later time when a relatively slow host processor is ready to analyze the data (e.g. when the electronic circuit breaker 34 is tripped and the host processor is idle again). A system block diagram is shown in FIG. 8. The output capacitor 39 sets the frequency range of operation. The signal is first filtered with an analog bandpass filter 52 that is tuned to a frequency range where LCR oscillation is expected to occur, such as in the range of between 585 kHz and 3 MHz. This filter 52 also serves as an antialiasing filter before an A/D converter 54. Output of the bandpass filter 52 is fed into the A/D converter 54 constantly sampling at 6-10 Ms/s. The A/D converter 54 writes directly into a circular buffer memory without requiring processor involvement.

In a worst case scenario circular buffer 56 must be large enough to store the waveform data from the instant the arc 26 occurs to the time when the ECB 34 recognizes the event and trips. At this point the event trigger 58 will send a stop signal 60 to the A/D converter 54. This time window can be anywhere from tens of microseconds to hundreds of milliseconds depending on the fault conditions. At the 6 Ms/s rate, a 10 bit A/D converter 54 will constantly deliver 750 kBytes of data for every 100 ms into the circular buffer 56 to be processed in the event of trip. For a 10 Ms/s rate, that number will double.

Another approach is to implement an analog event trigger 58 circuit that will stop 60 the A/D converter 54 independent of microprocessor 40 when LCR oscillation 44 is detected. This circuit can be as simple as a rectifier, averager/integrator and a comparator that will constantly monitor the output of the band pass filter 52. Reducing the trigger time will reduce the total waveform sample size. As soon as the microprocessor 40 is ready to process the data, it will use a built in algorithm (such as fast fourier transform analysis (FFT) with ability to locate frequency peaks) to perform the distance to fault (DTF) evaluation and transfer the waveform data to an external host as needed.

Success of the methods described above in locating an arc fault in real time depends on the arc fault event itself, magnitude of $R_{arc}$, and arc voltage. The percent error in method two, utilizing inductor di/dt, is a function of initial load current, resistance of the arc and time. When $R_{arc}$ is approximately 0 ohms, the expected vs. measured di/dt was within 2% error indicating that this method will work if $R_{arc}$ is close to 0 ohms or when conductors are briefly welded together to produce low section feeding into the electronic circuit breaker that adds inductance as well as any internal inductors that are in series with the harness.

Unlike the first method, utilizing wire resistance, and the second method, an apparent advantage of method three, utilizing the resonant frequency of LCR oscillation, is that the distance to fault computation depends less on resistance of an arc and does not depend on load current, time or wire sections feeding to the electronic circuit breaker. From the experimental data that follows, we conclude that method three offers the most potential as a solution for real time distance to fault measurements. However, it is also the most complex of three to implement.

The first method is the easiest to implement. But since with this method of distance to fault determination depends only on resistance of the wires, a significant error can potentially be introduced by the unknown arc resistance that falls in series with the resistance of the wires. Despite that, this technique can still be used to initially predict the distance range or section of the wire where the fault is located by using the peak current draw during the arc fault event to report one of the two possible outcomes: fault occurred within critical distance length of the wire or fault location is uncertain. Minimum hardware, if any at all, changes would be required to implement the first method into a current electronic circuit breaker.

Advantages of the methods and systems described above will become more apparent from the Examples that follow:

EXAMPLES

Example 1

Wire Resistance Method

The data below was collected to determine the critical wire length point for different wire gauges and electronic circuit breakers fast trip points. The fast response trip point was set at 10× and the input voltage set at 28V DC. The critical length point of the wire is derived directly from the resistance value beyond which the short circuit current drops below the 10× rating of the circuit breaker. This point can be defined as a critical resistance.

$$R_{critical\ resistance} = V_0/10 \times ECB\ Rating \quad (21)$$

Critical length of the wire with given AWG can be calculated by:

$$Critical\ Length = R_{critical\ o}/R\ per\ unit\ length \quad (22)$$

Resistance per unit of length is a characteristic of a wire having a given AWG. Table 1 shows some Critical Resistance and Critical Length values for ECBs and measured wire gauges.

TABLE 1

| ECB Rating (Amps) | Gauge (AWG) | Resistance per ft. (mOhms/ft) | Critical Resistance (Ohms) | Critical Length (ft) |
|---|---|---|---|---|
| 2.5 | 18 | 6.38 | 0.92 | 144 |
| 7.5 | 16 | 4.02 | 0.31 | 77 |
| 15 | 14 | 2.53 | 0.15 | 61 |
| 25 | 10 | 1.00 | 0.092 | 92 |
| 30 | 8 | 0.63 | 0.077 | 121 |

Table 1 can be used to compute critical length with any combination of ECB 10× rating and wire gauge. As an example for a 15A breaker using 16 AWG wire:

| ECB Rating | AWG | MOhms/foot | Critical resistance | Critical length |
|---|---|---|---|---|
| 15A | 16 | .02 | 0.15 | 37 feet |

Suggesting if electronic circuit breaker results in a hard trip, the fault is within 37 feet of wire.

Example 2

Using Inductor di/dt Method

The experimental set up was 17 feet of 14 AWG wire. The inductance of AWG 14 wire was measured to be 283.8 nH per foot. The 17 feet of AWG 14 wire had an inductance of 4.82 µH and $R_{wire}$ was 0.067 ohm. The voltage source delivered 28V DC. For the purposes of initial evaluation it was assumed that a typical aircraft AC voltage source appears as a DC source for the duration of the di/dt events described herein. The half cycle time of the 400 Hz source frequency is 1.25 ms which is much greater than the typical range for the time content of LR circuit (<10 µS) Behavior of the setup can be predicted by using previously derived equations. di/dt rise time vs. distance to fault when $R_{arc}=0$ ohm is illustrated in graph form in FIG. 9.

Figure 9:
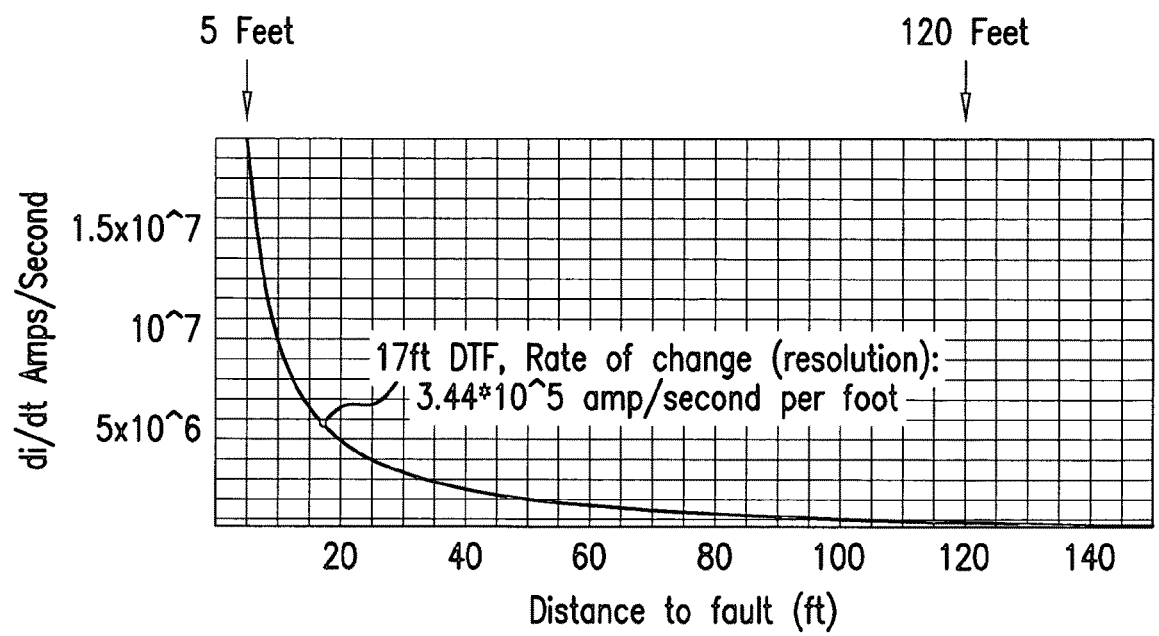
FIG. 9 illustrates di/dt as a function of the distance to fault in accordance with the second embodiment.
Figure 10A:
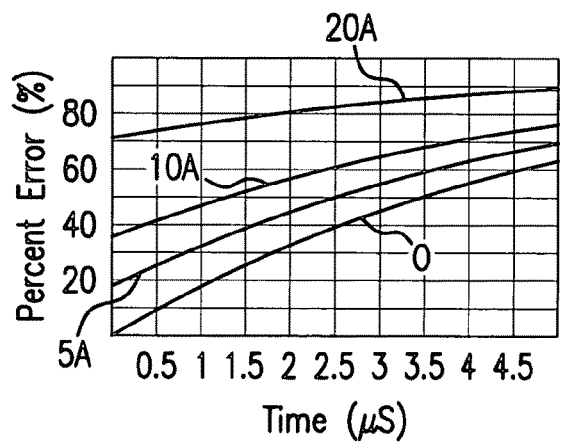
FIG. 10A illustrates the percent error in the computation of distance to fault from FIG. 9 when $R_{arc}$ is 1 ohm and FIG. 10B illustrates the percent error when $R_{arc}$ is 2 ohms.
Figure 10B:
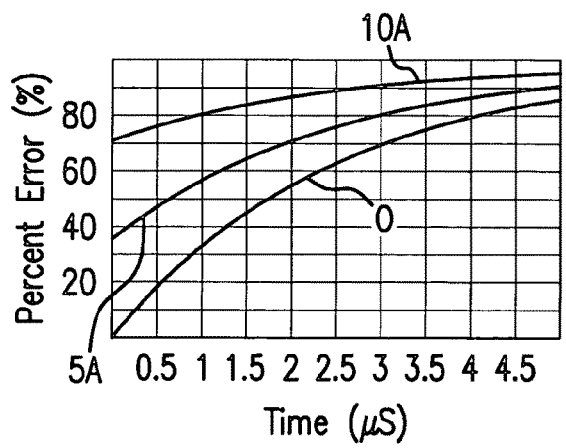

The FIG. 9 distance to fault graph is a non-linear curve with a maximum resolution (change in di/dt per foot) of 3.9 amps/µSec per foot at 5 feet and a minimum resolution of 0.006863 amps/µSec per foot at 120 feet. The percent error in computing distance to fault for the above setup with 17 feet of AWG 14 wire is given by Equation 10 and plotted on FIGS. 10A and 10B. These graphs are plotted for different value of initial load current (0, 5, 10, 20 amps). On FIG. 10A, $R_{arc}$ is 1 ohm and on FIG. 10B, $R_{arc}$ is 2 ohms.

Figure 11A:
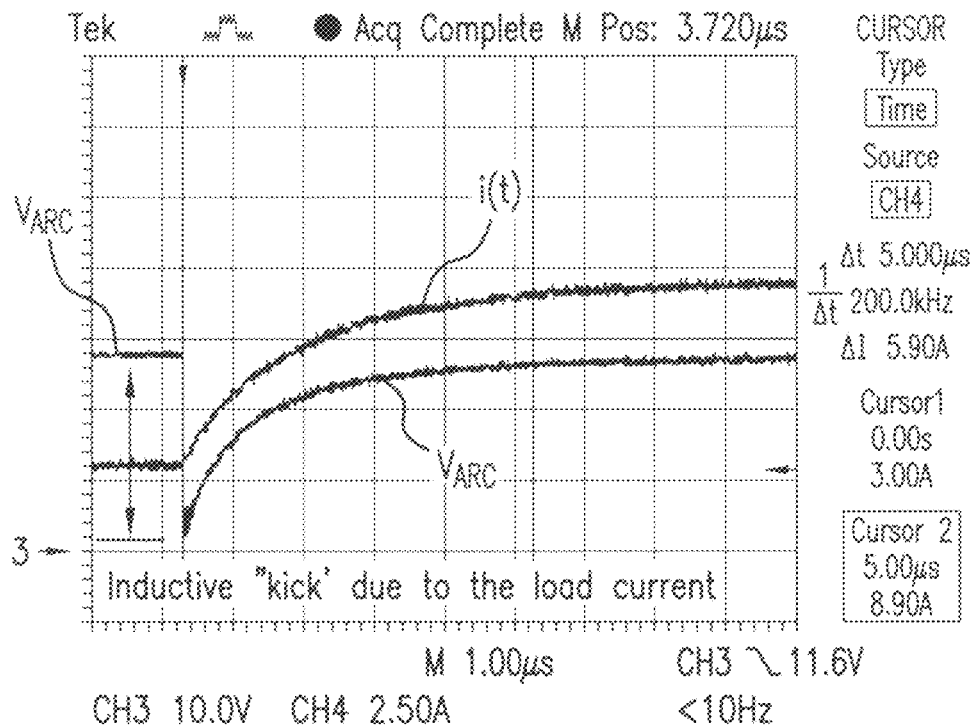
FIG. 11A illustrate a waveform from the second embodiment when $R_{arc}$ is about zero and FIG. 11B illustrates a waveform when $R_{arc}$ is 7.5 ohms.
Figure 11B:
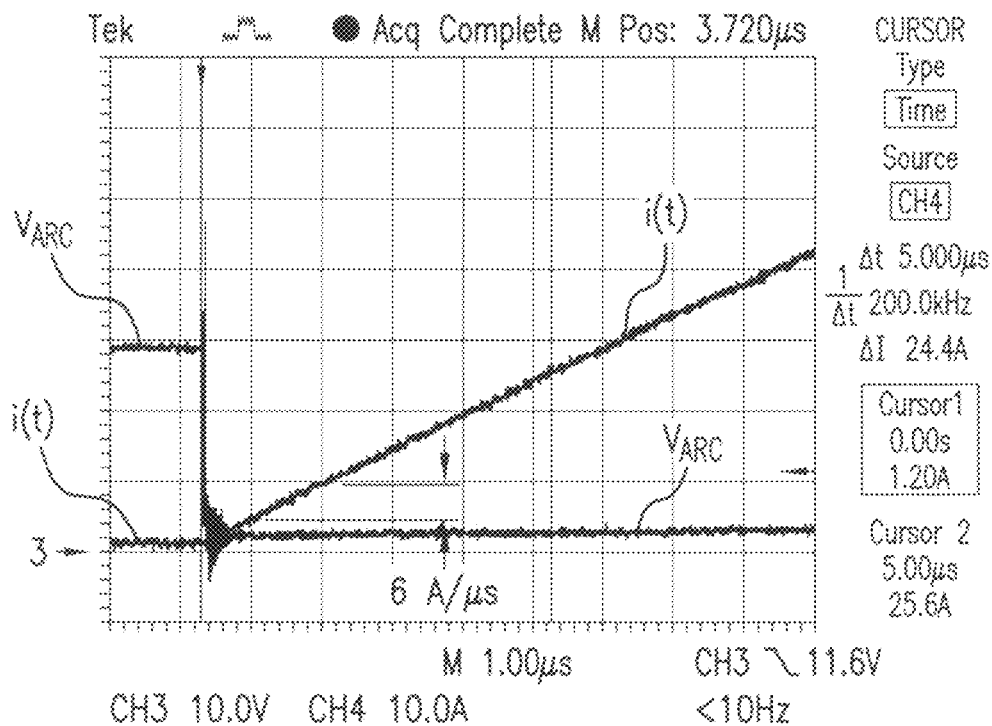

The percent error graphs show that measured di/dt value will deviate by more than 15% from ideal at t=1 µSec when $R_{arc}$ is 1 ohm and $I_{load}$ is 0 amp. With increased initial load current the error will increase further. The expected di/dt with 17 feet of AWG 14 wire and $R_{arc}=0$ ohm is di/dt=28V/4.8 µH=5.8 A/µSec. FIGS. 11A and 11B show the captured waveforms showing the i(t) for the $R_{arc}$~0 ohm (FIG. 11A) and 7.5 ohm (FIG. 11B) with $I_{load}$ at 3 amps (FIG. 11A) and 0 amp (FIG. 11B). With presence of $R_{arc}$, the di/dt is distorted from ideal. With 7.5 ohms $R_{arc}$ and 3.0 amps for $I_{load}$, di/dt is measured to be 3.25 amps/µSec approximated by a line from 0-1 µSec time period which results in a 43% error. When $R_{arc}$ is near 0 ohms, di/dt was measured to be 6 Amps/µSec which deviates by 2% from the expected value.

Example 3

Resonant Frequency of LCR Oscillation

The set up included 19 feet and 25 feet of 14 AWG wire. The inductance of the AWG 14 wire was 283.8 nH per foot. The 19 feet of AWG 14 wire had an inductance of 5.62 µH with $R_{wire}=0.072$ ohm. The 25 feet of AWG 14 wire had an inductance of 7.09 µH of inductance with $R_{wire}=0.145$ ohm. The voltage source was DC at 28V with $L_{decoupling}=5$ mH. It was assumed that the typical aircraft AC voltage source may be considered a DC source for the LCR oscillation events evaluated. The half cycle time of a 400 Hz source frequency is 1.25 ms which is much greater than the typical duration of an LCR oscillation, which is typically 20-30 µSec.

The initial value for $C_{out}$ was 9.89 nF forcing the LCR resonant frequency range to be around 272 kHz-1.3 MHz for AWG 14 wire of 5 ft-120 ft distance range. There was a significant decay in amplitude of oscillation of the captured waveforms indicating that energy was dissipated elsewhere in the circuit (most likely through the $L_{decoupling}$ and source). Choosing a smaller value of $C_{out}$, and corresponding higher frequency range, has a number of advantages. It provides greater change in frequency per foot ($\Delta\omega_o/ft$), reduces the % Error that can potentially be introduced by $R_{arc}$ as seen from Equation 20, and increases the Critical Resistance value. A higher frequency range will also allow longer oscillation time (less energy is leaked through $L_{decoupling}$) which results in higher signal to noise ratio in frequency domain. At higher resonant frequencies we can keep $L_{decoupling}$ relatively small, saving space and reducing power dissipation of the ECB. But these advantages will come at the expense of increased hardware complexity (faster A/D converters, larger storage memory, longer processing time, etc). Also, a smaller value for $C_{out}$ can potentially increase the effect of an error introduced by parasitic capacitance of the harness that appears in parallel to $C_{out}$.

Figure 12:
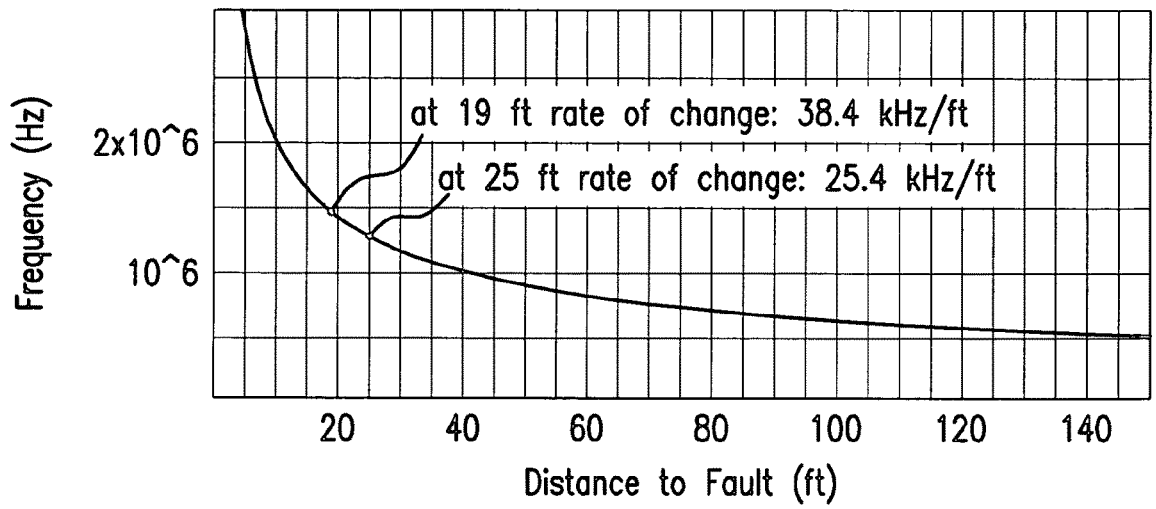
FIG. 12 illustrates frequency as a function of the distance to fault in accordance with the third embodiment.

The experiment was repeated with $C_{out}$ of 2.17 nF forcing the frequency range to be 585 kHz-2.86 Mhz with improved results. The data that follows relates to this latter case. Before data collection, behavior of the set up was estimated using the above formulas. The worse case critical resistance point occurs with minimum inductance wire at 5 ft. From Equation 15, this is equal to 51.0 ohms. In other words, in order for the oscillation to occur on the entire distance range (5 ft-120 ft) of the AWG 14 wire the series resistance $R_{arc}+R_{wires}$ (or simply $\sim R_{arc}$) must be less than 51.0 ohm. Frequency range vs. distance to fault is plotted on FIG. 12 and is given by $f_o=\omega_o/2\pi$. The frequency vs. distance graph is a non-linear curve with greatest change in frequency per foot being 284.5 kHz/ft at 5 feet and the smallest being 2.4 kHz/ft at 120 feet with an assumption that the typical harness length on an aircraft is between 5 and 120 feet.

Expected resonant frequency at 25 feet is $1/(7.09~\mu H*2.17~nF)^{0.5}=8.06*10^6$ rad/sec=1.283 MHz. Expected critical resistance at 25 feet is 114.3 ohms.

Expected resonant frequency at 19 ft. is $1/(5.62~\mu H*2.17~nF)^{0.5}=9.05*10^6$ rad/sec=1.442 MHz. Expected critical resistance at 19 ft is 101.8 ohms.

Figure 13:
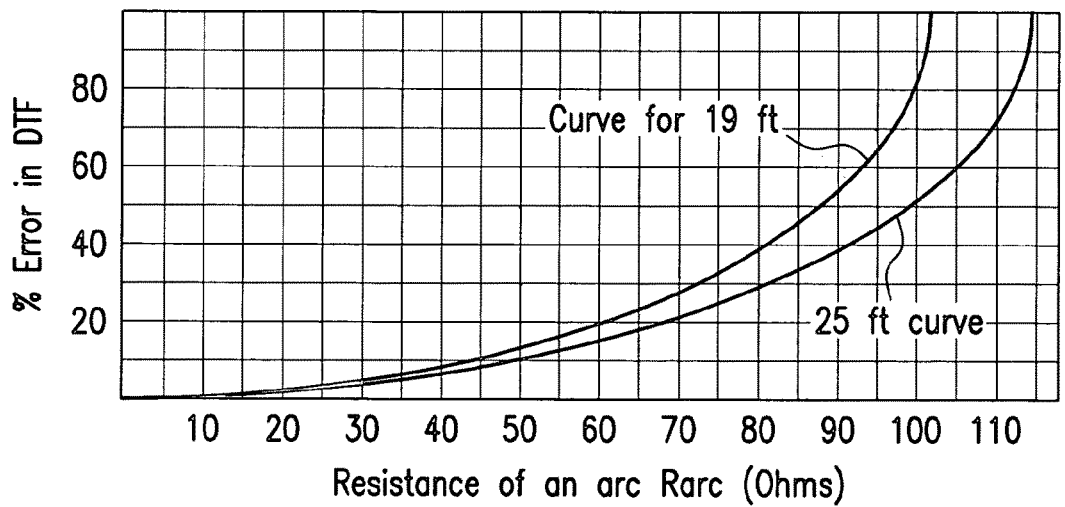
FIG. 13 illustrates the percent error in the computation of distance to fault from FIG. 12 when $R_{arc}$ is 0 ohm.

If we assume that the $R_{arc}$ is zero ohms, the percent error in computing the distance to fault is given by Equation 20 and is plotted on FIG. 13.

Figure 14A:
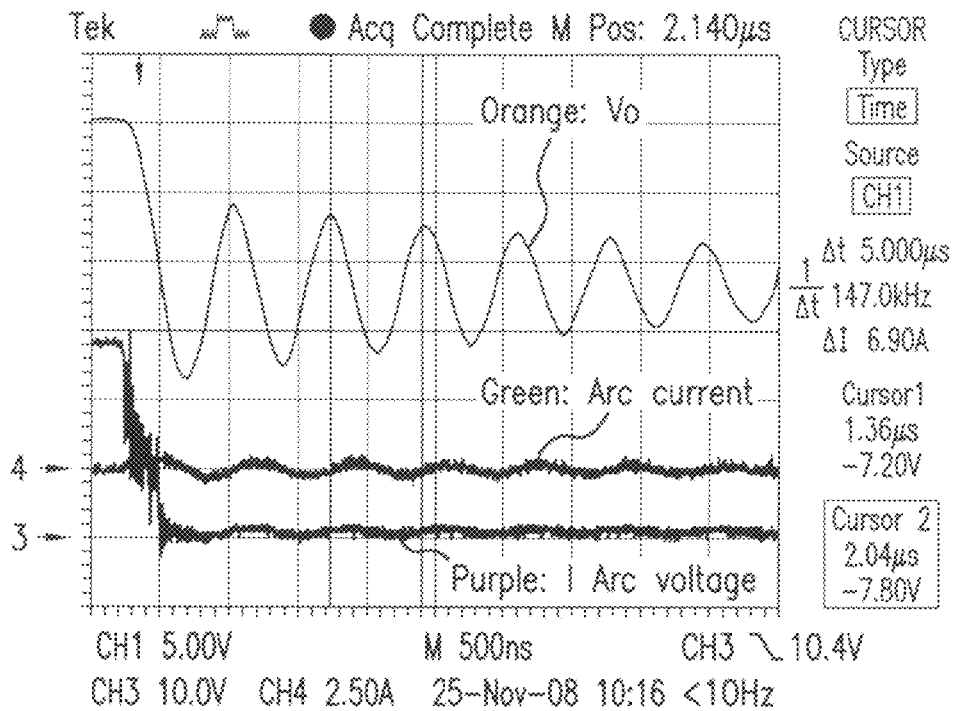
FIG. 14A graphs arc current, arc voltage and source voltage for a 19 foot distance to fault and FIG. 14B graphs those parameters for a 25 foot distance to fault.
Figure 14B:
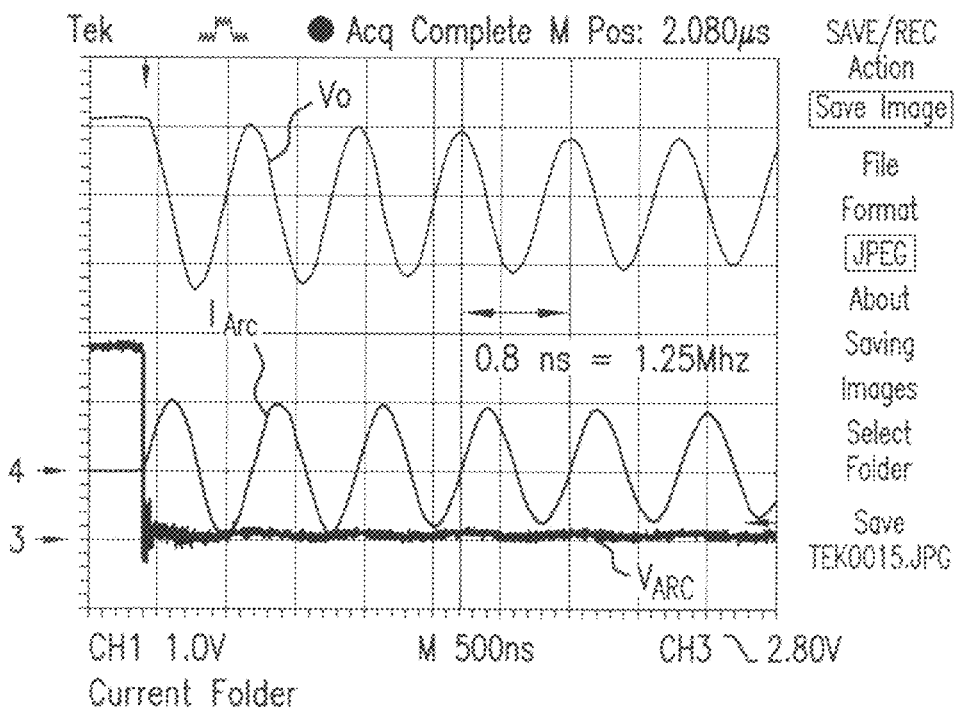
Figure 15A:
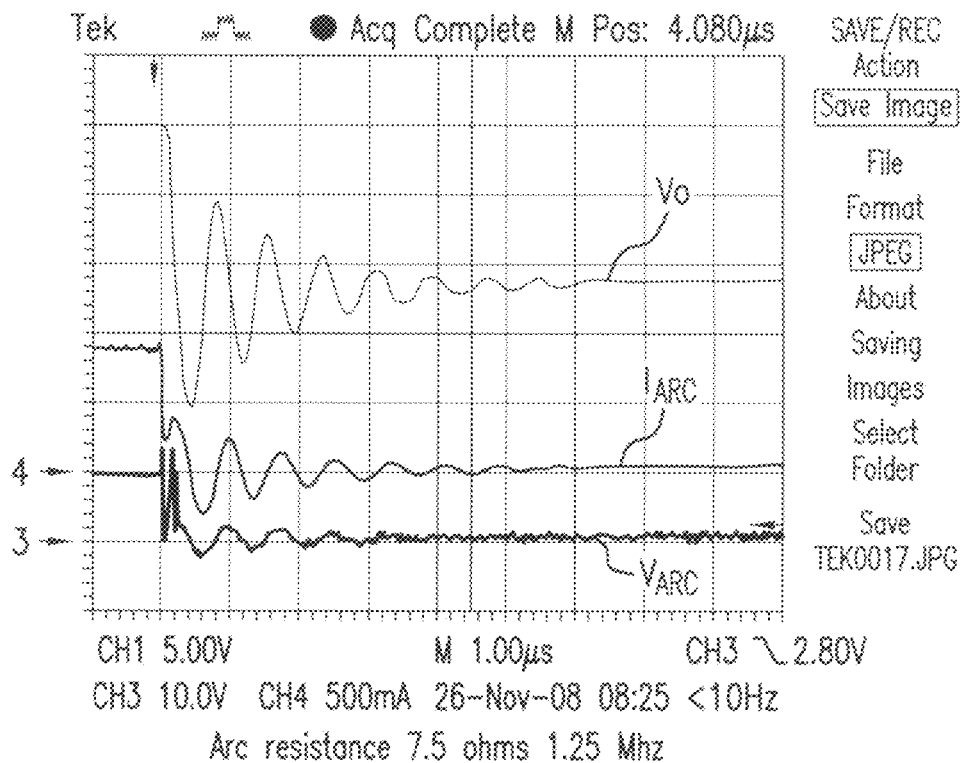
FIG. 15A illustrates oscillation damping when the arc resistance is 7.5 ohms, FIG. 15B when the arc resistance is 15 ohms and FIG. 15C when the arc resistance is 30 ohms.
Figure 15B:
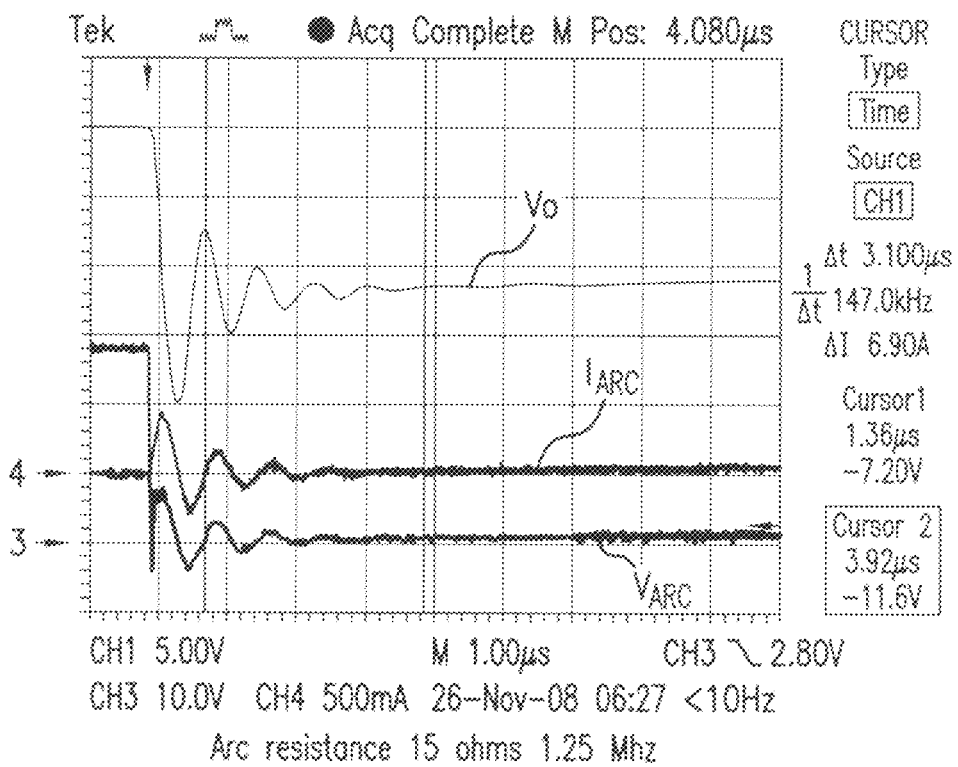
Figure 15C:
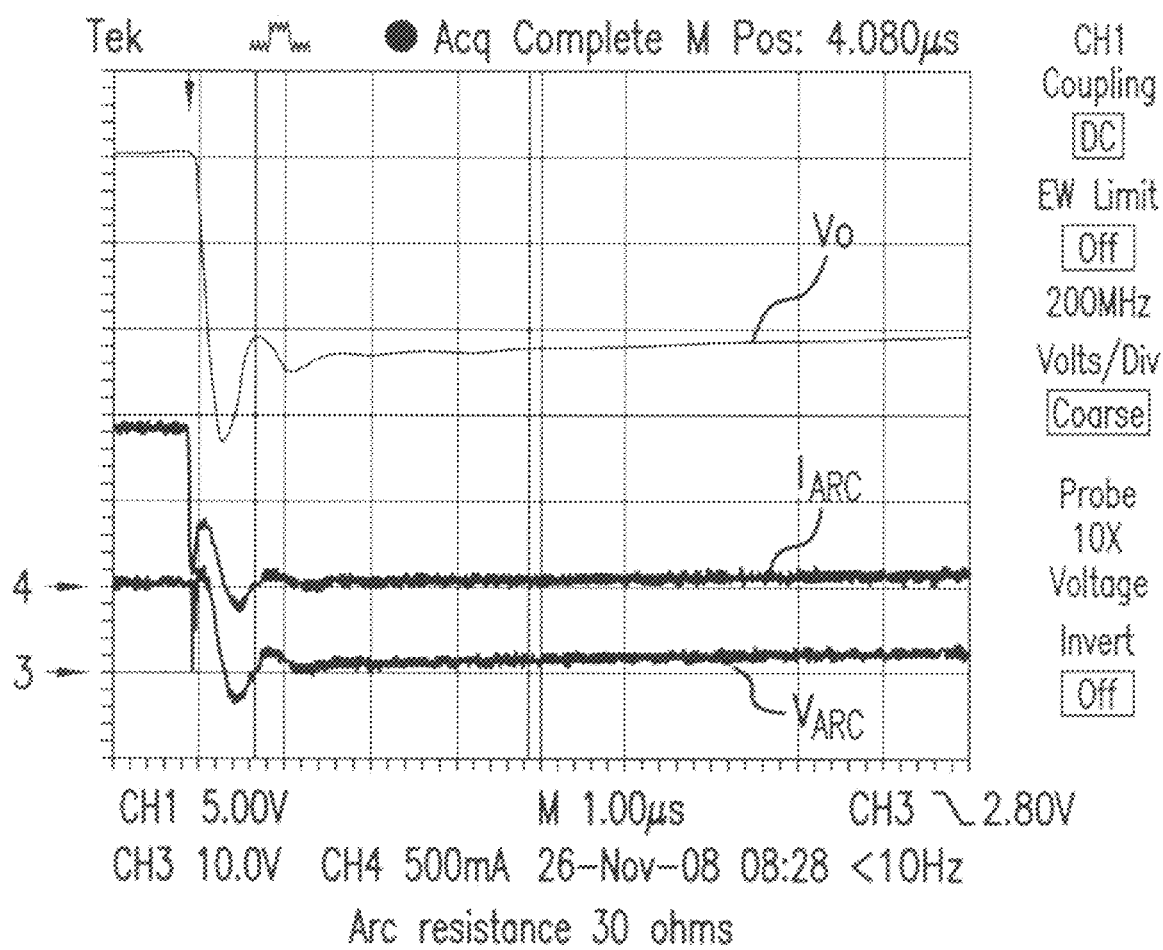

FIG. 14 displays the arc current, arc voltage and $V_o$ at 19 foot (FIG. 14A) and 25 foot (FIG. 14B) fault locations. The frequency of the oscillation was measured to be 1.47 Mhz for the 19 foot fault location and 1.25 Mhz for the 25 foot fault location, with arc resistance near 0 ohm. The arc resistance was monitored by monitoring the arc current and the arc voltage behavior. In order to see the effect of arc resistance on overall waveform, $R_{arc}$ was adjusted by using low inductance carbon composition resistors in series with an arc itself. Increasing $R_{arc}$ also increases the arc voltage. FIGS. 15A, 15B and 15C display the obtained waveforms from the 25 ft fault locations.

Although an expected critical resistance for $R_{arc}$ is above 100 ohms, the waveforms (FIGS. 15A, 15B and 15C) illustrate that at 30 ohms of arc resistance the oscillation is already severely damped. At $R_{arc}=30$ ohms, the percent error in resonant frequency and corresponding distance to fault is minimal, less than 5%. The measured frequency of resonant oscillation was 1.25 Mhz, slightly less than the expected value of 1.28 Mhz, resulting in 2.3% error. An observed sharp decay in amplitude of the captured waveforms cannot be entirely attributed to the in-series arc and wire resistance only. Energy stored in the LCR loop has many ways of escaping. Some of it is dissipated through $L_{decoupling}$ and eventually through the source itself. Although $L_{coupling}$ presents relatively large impedance to LCR loop for our frequency range, a portion of the energy will inevitably be dissipated through it. Furthermore, inductance of the $L_{coupling}$ is not a fixed value. A sharp rise of short circuit current that the arc creates will start to saturate the core of the $L_{coupling}$ causing its inductance and thus its impedance to drop. This effect further dampens the amplitude of the resonant oscillation.

Figure 16:
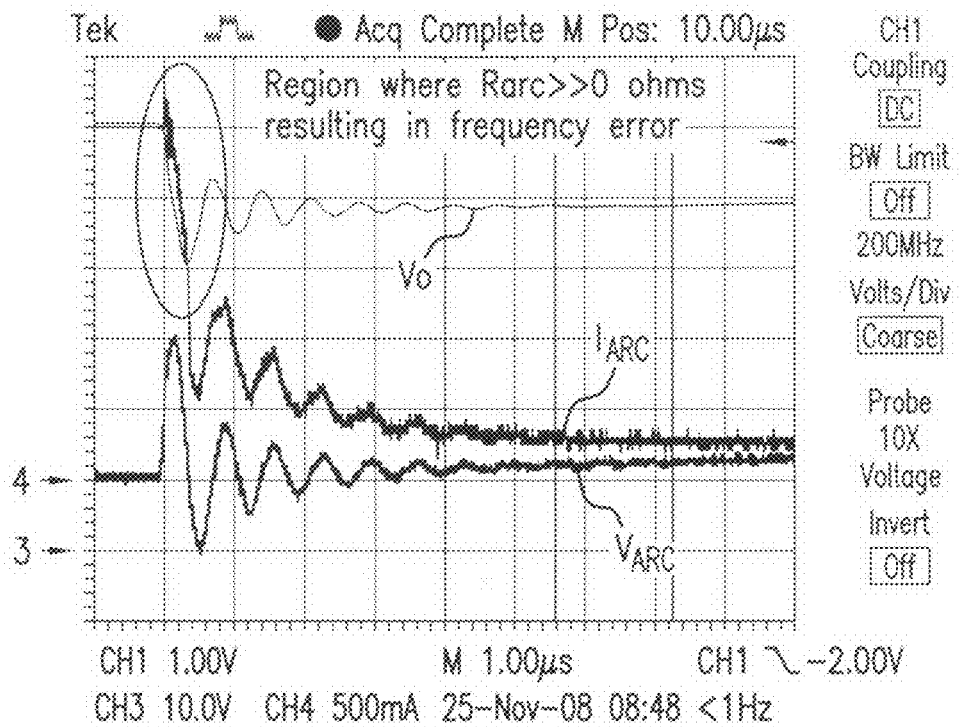
FIG. 16 is a waveform illustrating arc current and arc voltage for a 19 foot distance to fault.

Given the nature of the high current arc, at the instant when a fault occurs, the arc voltage does not always drop to zero volts in a step function. A zero volt arc voltage drop is usually a brief short circuit condition during the arc fault event. On a microscopic scale, motion on the faulty wires, vibration forces, melting and rapid evaporation of metal all have a direct effect on behavior of the arc voltage and thus arc resistance Waveforms on FIG. 16 show the arc current and arc voltage captured during one of the parallel arc faults on a 19 foot arc fault location. In this example, the arc voltage drops exponentially from the instant a fault occurs rather than in a step. Arc resistance follows the same curve dropping to about 1.3 ohms when oscillation occurs. In cases like this, where the arc resistance $R_{arc}$ does not drop in a step function from infinite to zero, the damping factor will be increased (and no longer be a static parameter) effectively reducing the amplitude decay rate. However, the drop of $R_{arc}$ is fast enough to have a minimum effect on the resonant frequency of oscillation. $V_o$ waveform shows that the frequency of oscillation is still 1.42 Mhz which is within 1% of the expected frequency.

Figure 17:
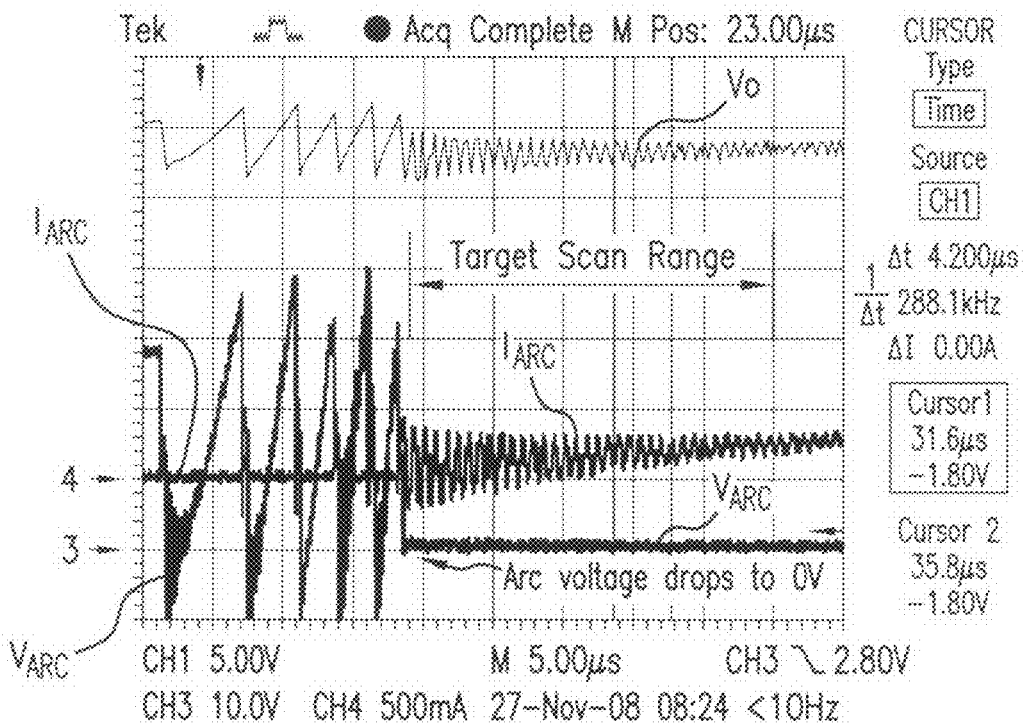
FIG. 17 is a waveform illustrating irregular arc voltage.

FIG. 17 illustrates another example of captured waveform where arc voltage behaves irregularly before dropping to 0 volts. LCR oscillation occurs 20 μSec from the instant of arc strike. The amplitude of oscillation is significantly lower than in previous cases. This is expected since initial energy stored in $C_{out}$ is dissipated by an arc prior to the actual oscillation event. In all the cases, with the set up used, presence of LCR oscillation will occur if the arc resistance rapidly drops below 30 ohms at some point during arc fault event.

Figure 18:
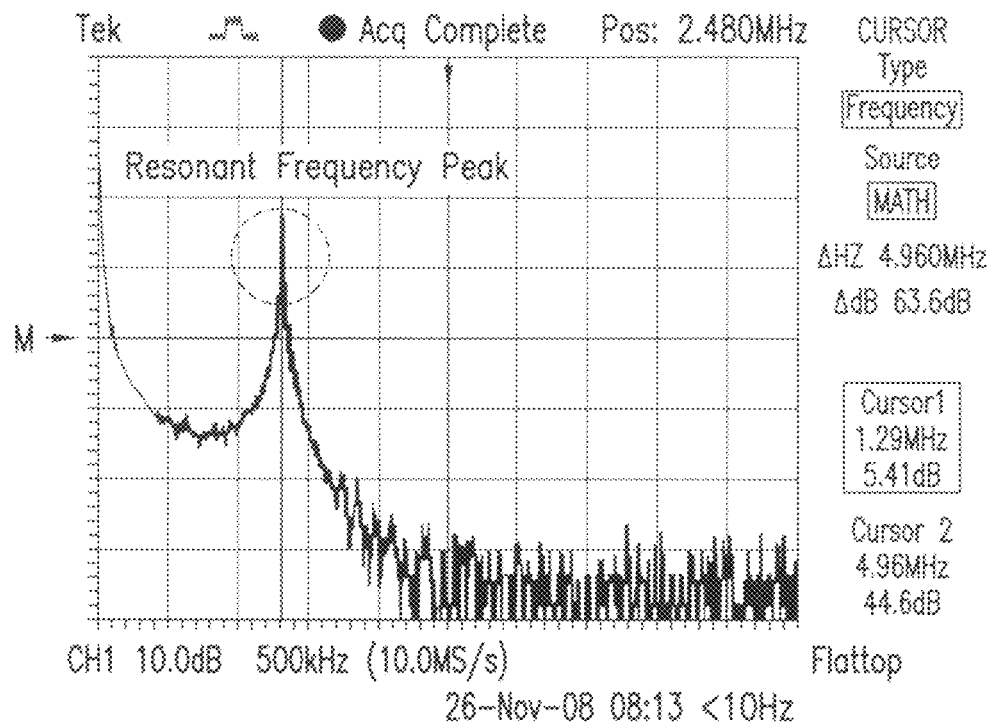
FIG. 18 is a fast fourier transform (FFT) analysis of the waveform of FIG. 14B.
Figure 19:
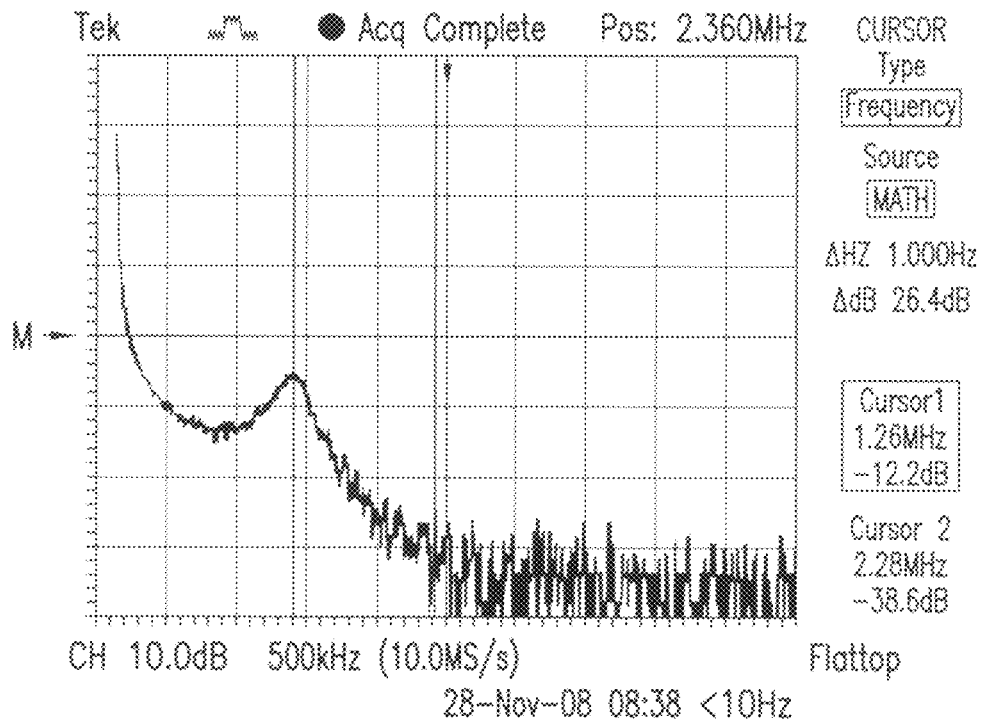
FIG. 19 is a fast fourier transform analysis of the waveform of FIG. 15B.

Frequency content of the captured waveforms can be examined by applying a fast fourier transform analysis (FFT). FIG. 18 shows an FFT waveform obtained from the time domain waveforms of FIG. 14B and FIG. 19 shows an FFT waveform obtained from the time domain waveforms of FIG. 15B. The sampling rate used to generate these waveforms was 10 Ms/s and corresponds to general mid to upper range A/D converters on the market. The FIG. 18 waveform shows FFT of the frequency waveform where $R_{arc}$ is near 0 ohm. The FIG. 19 waveform shows FFT of the waveform with $R_{arc}=15$ ohms. The frequency peak occurs at 1.29 Mhz and is clearly visible in both, however there is at least 14 dB reduction in magnitude due to 15 ohms added arc resistance.

Figure 20:
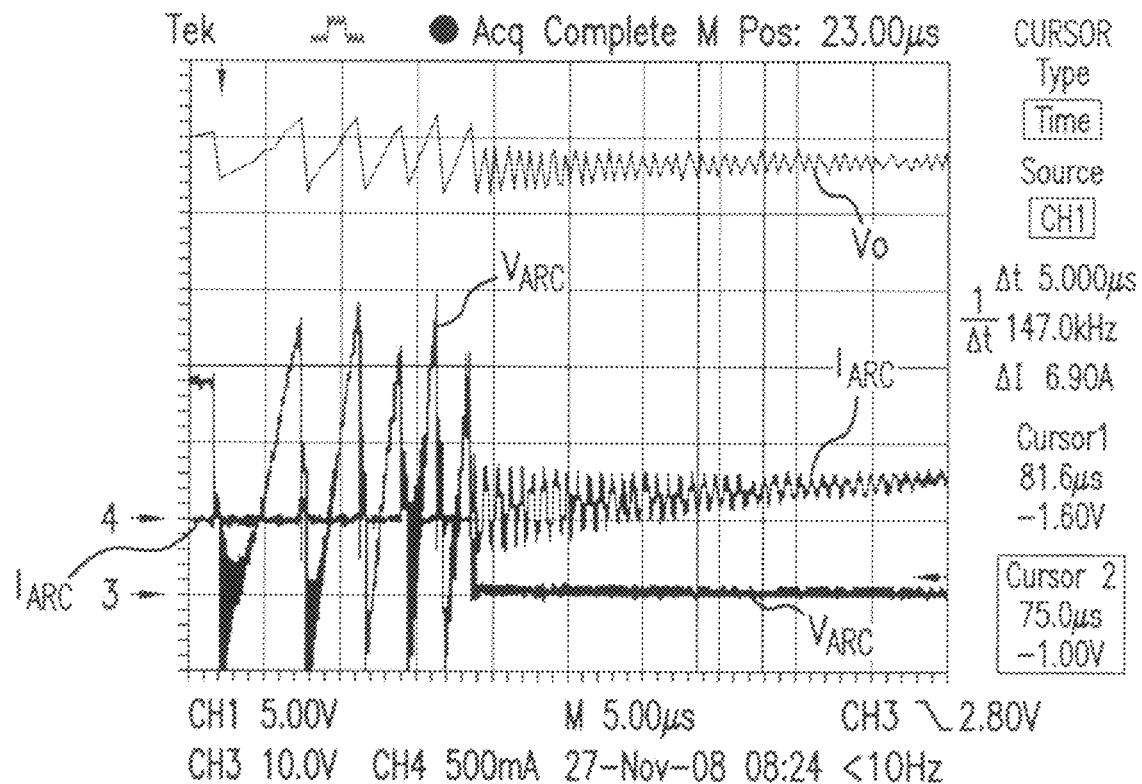
FIG. 20 is a waveform illustrating rapid voltage noise prior to oscillation.
Figure 20:
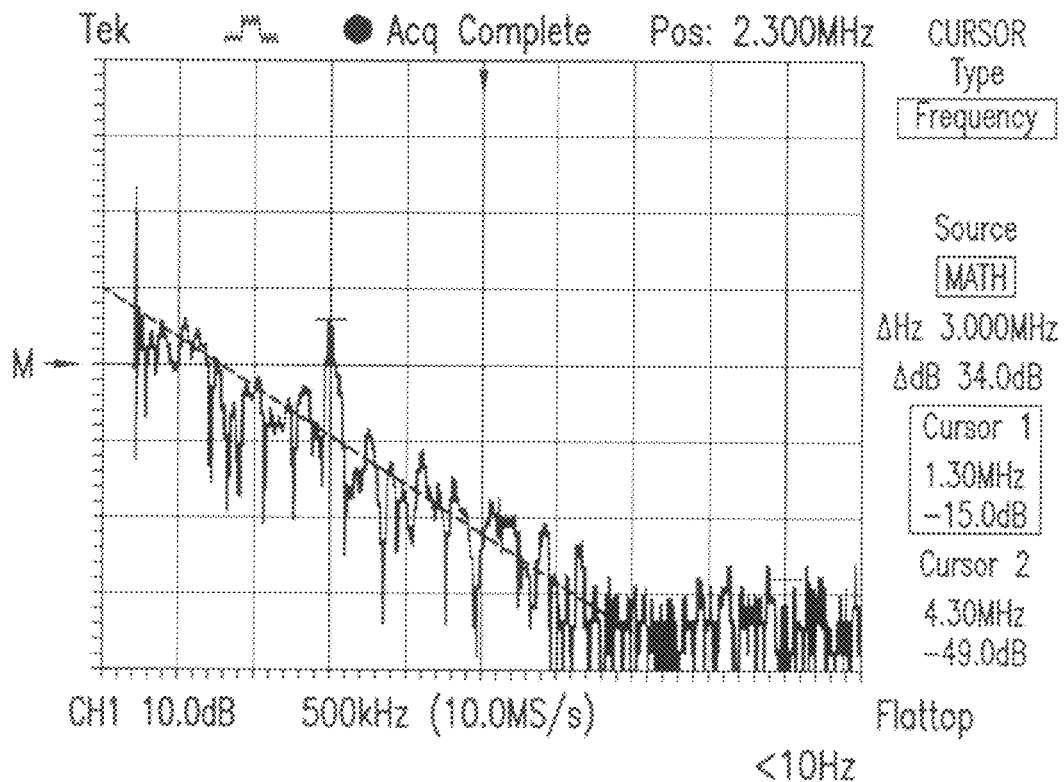
Figure 21:
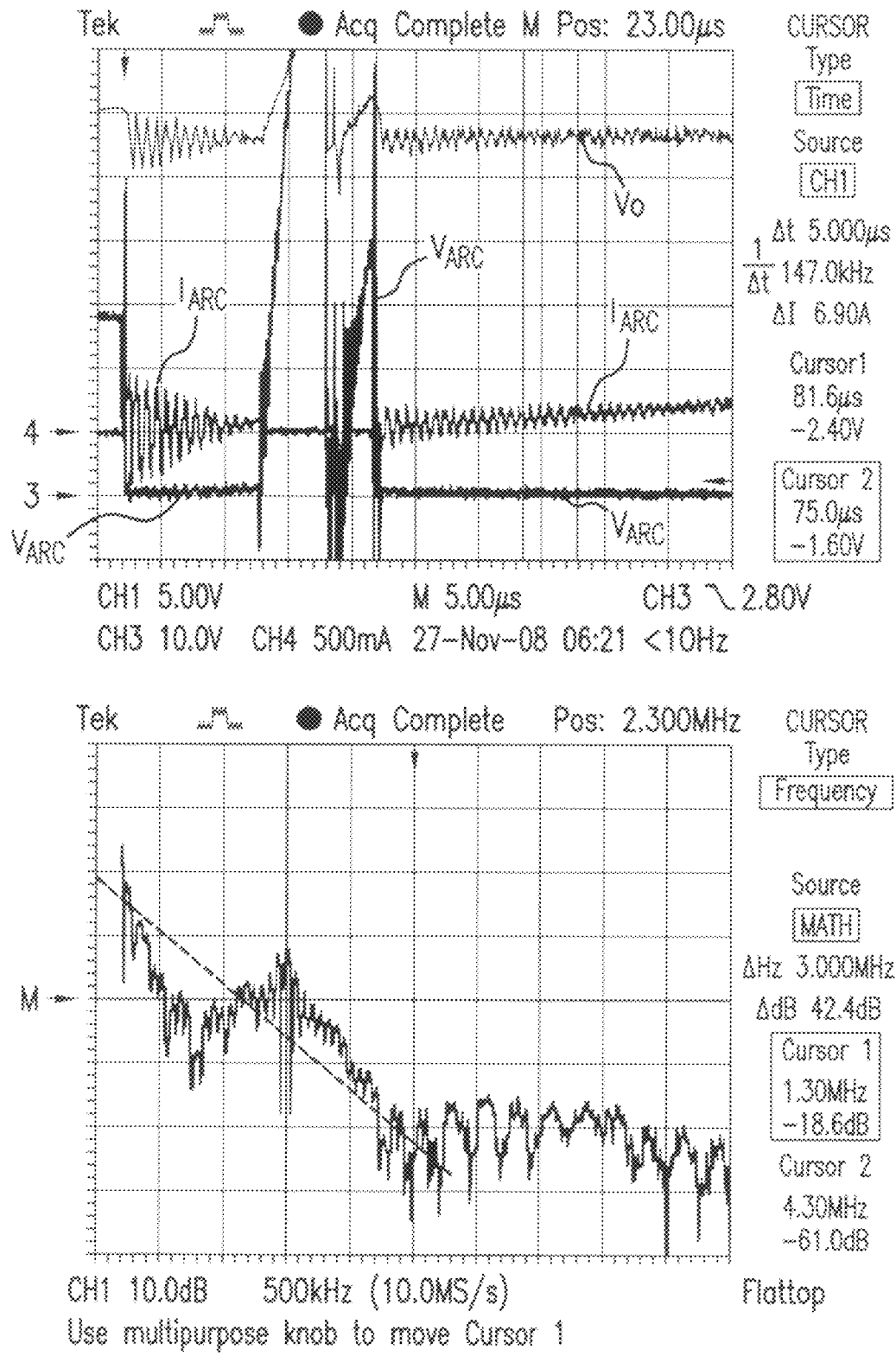
FIG. 21 is a waveform illustrating rapid voltage noise around the resonant frequency.
Figure 22:
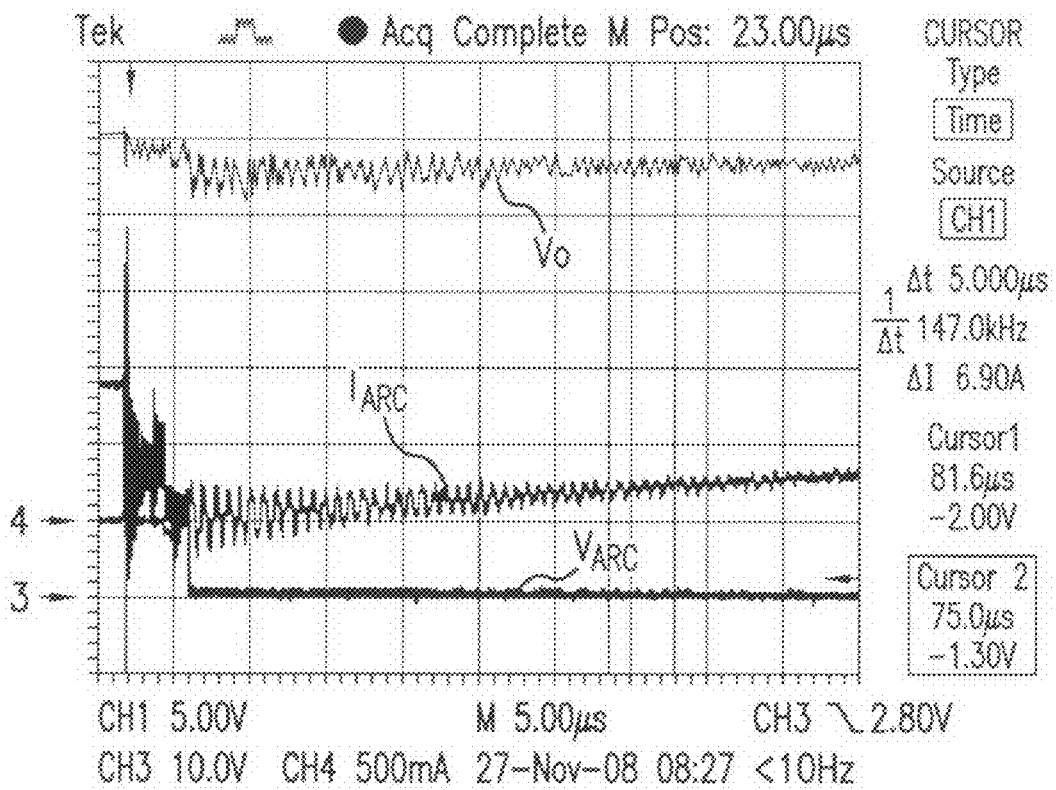
FIG. 22 is a waveform illustrating a relatively weak signal.
Figure 22:
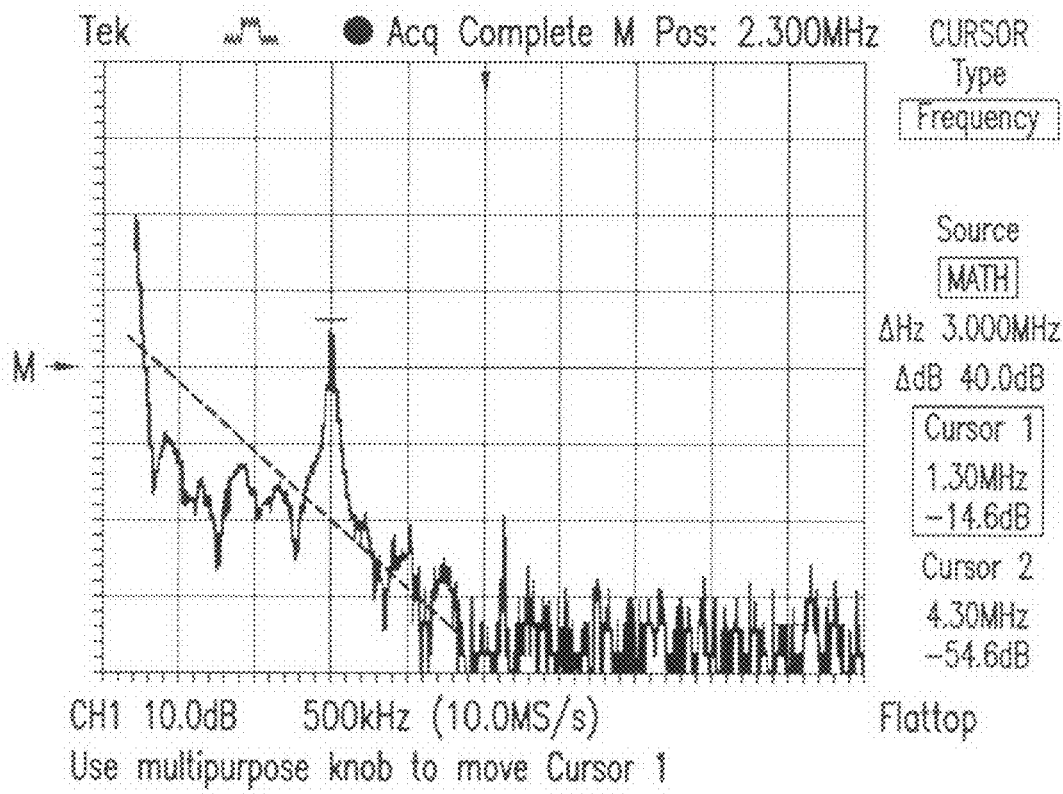

FIGS. 20, 21 and 22 show FFT (on right hand side) for several random waveforms of $V_o$ (on left hand side) obtained at a 25 foot arc fault location. FFT was applied to the "raw" signal without any preconditioning or filtering. The sample size for the FFT covers the entire waveform in a time domain as shown on the left. The frequency peak value in all of the waveforms was 1.30 Mhz which is within 2% of the expected value. FIG. 20 illustrates rapid voltage noise prior to oscillation. FIG. 21 illustrates rapid voltage noise introduced halfway through the signal producing broad frequency noise around the resonant frequency. FIG. 22 illustrates a relatively weak signal.

FFT effectively isolates the frequency of interest from the background noise induced by the sporadic behavior of the arc voltage and can serve as one of the methods of determining the frequency in real time. Its performance can be improved by limiting the scan region to include only the location where actual LCR oscillation occurs. Simplest way to achieve that is by introducing a band-pass filter at the input tuned to the frequency range of interest. Analog band pass filter at the input will attenuate all the frequencies outside the expected range improving the FFT performance.

One or more embodiments of the present invention have been described. Nevertheless, it will be understood that various modifications may be made without departing from the spirit and scope of the invention. Accordingly, other embodiments are within the scope of the following claims.

What is claimed is:

1. A method to measure a distance to a naturally-occurring parallel arc fault between a current carrying first wire bundled in a wiring harness having a plurality of parallel running wires and one of a second wire and an air frame, said parallel arc fault emanating from said first wire that has a voltage source and electronic circuit breaker at a first end thereof and a load at a second end thereof, comprising the steps of:
   prior to occurrence of said parallel arc fault, inserting an output capacitor of known capacitance and an isolating inductor of known inductance on an output of said electronic circuit breaker wherein said output capacitor is electrically interconnected to said first wire and to said one of said second wire and said air frame, and the inductor is in series with the electronic circuit breaker;
   measuring a resonant frequency of an oscillating arc current when said parallel arc fault occurs around an LCR loop defined by said output capacitor, said first wire, said parallel arc fault and said one of said second wire and said air frame, said oscillating arc current caused by occurrence of said parallel arc fault;
   detecting and interrupting said parallel arc fault using said electronic circuit breaker;
   calculating an inductance L of said LCR loop in accordance with said measured resonant frequency and said known capacitance; and
   utilizing an inherent inductance per unit of length of said first wire K against said one of said second wire and said air frame to determine a distance to fault (DTF) as DTF=0.5(L/K).

2. The method of claim 1 wherein said wiring harness is installed on an aircraft.

3. The method of claim 2 wherein subsequent to said measuring step, a waveform of the oscillating arc current is stored in memory to permit determining a distance to a fault step to be calculated at a later time.

4. The method of claim 3 wherein said later time is subsequent to tripping of said electronic circuit breaker.

5. The method of claim 2 including measuring the amplitude decay of a waveform of the oscillating arc current.

6. The method of claim 2 wherein said output capacitor is selected to have an initial value of from 1 nF to 15 nF.

7. The method of claim 6 wherein said output capacitor is selected to have an initial value of from 2 nF to 5 nF.

8. The method of claim 6 wherein said first wire is selected to have a length of from 5 to 120 feet and said loop to have a series resistance of less than 51 ohms.

9. A system to measure a distance to a parallel arc fault between a current carrying first wire contained within a wiring harness and one of a second wire and an air frame, comprising:
   a voltage source;
   a load;
   said wiring harness having a plurality of parallel running insulated wires including said first wire and said second wire, wherein at least one of said first wire and said one of said second wire and said air frame electrically interconnects said voltage source and said load;
   a decoupling inductor having a fixed known inductance disposed between said voltage source and said wiring harness to electrically isolate in frequency said voltage source from said wires in said wiring harness;
   an output capacitor having a fixed known capacitance disposed between said decoupling inductor and said wires in said wiring harness;
   an output buffer to store data related to a waveform of a naturally-occurring oscillating arc current oscillating around an LCR loop defined by said output capacitor, said first wire, said parallel arc fault, and said second wire, said oscillating arc current caused by occurrence of said parallel arc fault;
   a circuit breaker to detect and interrupt said parallel arc fault subsequent to storage of said data by said output buffer; and
   a microprocessor in communication with said output buffer, said microprocessor programmed to:
      calculate a resonant frequency of said oscillating arc current;
      calculate an inductance L of said LCR loop in accordance with said measured resonant frequency and said known capacitance; and
      utilize an inherent inductance per unit of length of said first wire K against said one of said second wire and said air frame to calculate a distance to fault (DTF) as DTF=0.5(L/K);
   wherein said load draws current from said voltage source in a steady state condition prior to initiation of said parallel arc fault.

10. The system of claim 9 wherein said voltage source is an aircraft generator.

11. The system of claim 10 wherein said output capacitor has an initial value of between 1 nF and 15 nF and said at least one of said plurality of wires has a length of between 5 feet and 120 feet.

* * * * *